US010499525B1

(12) United States Patent
Singh

(10) Patent No.: US 10,499,525 B1
(45) Date of Patent: Dec. 3, 2019

(54) COMPUTING SERVER APPARATUS

(71) Applicant: Sunil G. Singh, East Brunswick, NJ (US)

(72) Inventor: Sunil G. Singh, East Brunswick, NJ (US)

(73) Assignee: SEVERCUBE, INC.

( * ) Notice: Subject to any disclaimer, the term of this patent is extended or adjusted under 35 U.S.C. 154(b) by 0 days.

(21) Appl. No.: 16/166,405

(22) Filed: Oct. 22, 2018

(51) Int. Cl.
*H05K 7/14* (2006.01)
*H05K 5/03* (2006.01)
*H05K 7/20* (2006.01)

(52) U.S. Cl.
CPC ............ *H05K 7/1487* (2013.01); *H05K 5/03* (2013.01); *H05K 7/1492* (2013.01); *H05K 7/1495* (2013.01); *H05K 7/20172* (2013.01)

(58) Field of Classification Search
CPC ...... H05K 7/1487; H05K 7/1492; H05K 5/03; H05K 7/1495; H05K 7/20172; H05K 7/20736; H05K 7/1488; G06F 1/20; G06F 1/181; G06F 1/184
See application file for complete search history.

(56) References Cited

U.S. PATENT DOCUMENTS

| | | | | | |
|---|---|---|---|---|---|
| 5,984,634 | A | * | 11/1999 | Teachout | G06F 1/16 361/695 |
| 5,986,882 | A | * | 11/1999 | Ekrot | G06F 1/20 361/679.47 |
| 6,088,224 | A | * | 7/2000 | Gallagher | G06F 1/184 165/104.33 |
| 7,813,146 | B1 | * | 10/2010 | Phan | G06F 1/189 361/792 |
| 9,583,918 | B1 | * | 2/2017 | Phan | G06F 1/189 |
| 2002/0116151 | A1 | * | 8/2002 | Brown | G06F 9/4843 702/186 |
| 2004/0064273 | A1 | * | 4/2004 | Le | G06F 1/266 702/60 |
| 2010/0115294 | A1 | * | 5/2010 | Hsieh Chen | G06F 1/263 713/300 |
| 2011/0304966 | A1 | * | 12/2011 | Schrempp | G06F 1/186 361/679.4 |
| 2014/0138068 | A1 | * | 5/2014 | Nienberg | H05K 7/20909 165/121 |
| 2018/0338384 | A1 | * | 11/2018 | Chu | H05K 7/1492 |
| 2018/0359878 | A1 | * | 12/2018 | Xu | H05K 7/1487 |
| 2019/0261534 | A1 | * | 8/2019 | Jochim | H05K 7/1489 |
| 2019/0297749 | A1 | * | 9/2019 | Bernardin | H05K 7/1492 |

* cited by examiner

*Primary Examiner* — Hoa C Nguyen
*Assistant Examiner* — Christopher L Augustin

(57) ABSTRACT

Disclosed is a computing server that is housed in a cabinet assembly. The computing server includes at least a power supply module, a first processing module, a second processing module, a motherboard module, a communication module, and a fan module. The computing server is the next-generation residential mini-supercomputers connected to other ServerCube (SC) Devices around the world forming the SC P2P swarm network. Set-up is simple, for example, plug and-play into any standard (1200-Watt) household outlet, requiring only a basic consumer broadband connection to connect to the internet. The SC Device offers commercial strength hash rate processing power (162 MH/s for ETH up to a maximum 225 MH/s), running over a basic 3 (three) Mbps connection. The SC device is also designed to be more energy efficient and uses 95% (ninety five percent) of its cubic space.

16 Claims, 7 Drawing Sheets

COMPUTING SERVER APPARATUS

FIELD OF THE INVENTION

The present invention relates generally to the field of a computing server housings, and, more particularly, to a computing server housing apparatus for housing various components of a computing server including at least one or more processing modules, communicating modules, storing modules, connecting modules, switching modules, computing modules, power modules, and cooling modules for performing designated operations associated with one or more myriad enterprise applications, whenever there is a need for strict and transparent data control with a mathematically sound function, for example Blockchain activities.

BACKGROUND

The explosive growth of the Internet has been driven to a large extent by the emergence of commercial service providers and hosting facilities, such as Internet Service Providers (ISPs), Application Service Providers (ASPs), Independent Software Vendors (ISVs), Enterprise Solution Providers (ESPs), Managed Service Providers (MSPs), or the like. Although there is no clear definition of the precise set of services provided by each of these businesses, generally these service providers and hosting facilities provide services tailored to meet some, most, or all of a customer's needs with respect to application hosting, site development, e-commerce management, and server deployment in exchange for payment of setup charges and periodic fees. In the context of server deployment, for example, the fees are customarily based on the particular hardware and software configurations that a customer will specify for hosting the customer's application or website that attracts humongous amount of data.

In today's world, a general-purpose computer has already been insufficient to deal with such humongous amount of data, so people often use a powerful computing system, such as a server, to store and process the data. Besides, because the cloud computing technology is the most popular development trend, the usage quantity of the server keeps raising. For example, with the advancement and usage of the Blockchain technology, the overall demand and improvisation of the server is also increasing.

The concept of the Blockchain technology is rooted in decentralization i.e., moving various types of data, processing the various types of data, and performing requisite functionalities away from central authorities. The resulting benefits are greater transparency, enhanced security through redundancy, increased trust through shared authority, as well as an immutable audit trail for a continuous and indefinite transactional history.

Blockchains are used for myriad enterprise applications whenever there is a need for strict and transparent data control with a mathematically sound function. However, today, most of these critical Blockchain activities operate under the current cloud computing paradigm which relies on large and standalone data centers. This concept of the centralized data centers is very antithesis of the definition of the Blockchain.

Additionally, these industrial scale operations employ command and control management models that are by nature vulnerable. Large datacenters concentrate computing power in a very monopolistic way. It requires faith and trust in a few multi-billion-dollar enterprises to validate access and guarantee security. All of this is in stark contrast to the Blockchain paradigm, which offers an open access model and relies on scalable computing power distributed around the world. Now, as the Blockchain applications multiply, the move to decentralize is reaching an inflection point, and thus options are needed immediately.

Also, when these large datacenters operate, a huge amount of heat is generated and causes the overheating issue. In many typical mainframe computers, inefficient heat dissipation performance is usually the case that causes the computer to malfunction. In addition, taking the power consumed by these servers of any common data center for instance, the power used by the heat dissipation system for maintaining the operation of such large datacenters is also twice as much. And not to mention that the complexity of the heat dissipation system for modern cloud data centers that are crowded with servers in high density is generally almost double compared to those for common data centers. Thus, the datacenters, in today's world, not only occupy large spaces but also consume a large amount of power.

In light of the foregoing, there exists a need for a technical and more reliable solution that solves the above-mentioned problems and provides a computing server device that is easy to move from one location to another location and occupies less space. Furthermore, the computing server device should reduce the loading of the heat exchangers, save energy, and facilitate earning opportunity to each user.

BRIEF SUMMARY

It is an objective of the present invention to provide a computing server apparatus including at least one or more processing modules, communicating modules, storing modules, connecting modules, switching modules, computing modules, power modules, and cooling modules that are connected with each other and are housed inside a cabinet assembly in a flexible manner. The cabinet assembly is designed with compact and sturdy structure for enclosing the computing server apparatus that can operate in private residences or in small clusters. The computing server apparatus is a small, high-computing, and high-powered processing computer that may be referred to as a ServerCube (SC) device. Each SC device includes multiple graphics processing units (GPUs) as well as other components which allow them to be used with blockchain-as-a-service (BaaS) applications, deep learning artificial intelligence (AI), virtual reality (VR) modelling, or the like. The cabinet assembly enclosing the SC device is intended for distribution to residencies, small offices, libraries, churches, and schools. The goal is to create a global high-density swarm computing network without owning or building datacenters, which are very expensive to build and manage and occupy very large spaces. Swarm intelligence utilizes mobile software agents for network management. These agents are autonomous entities, both proactive and reactive, and have the capability to adapt, cooperate and move intelligently from one location to the other in the communication network. Swarm intelligence, in particular, uses stigmergy (i.e. communication through the environment) for agent interaction. Swarm intelligence exhibits emergent behavior where in simple interactions of autonomous agents, with simple primitives, give rise to a complex behavior that has not been specified explicitly.

According to an aspect of the present invention, there is provided a computing server housed in a cabinet assembly. The computing server comprises a power supply module placed on a bottom surface of a back section of the cabinet assembly. The power supply module is externally connected to a power supply source by means of an external power chord. The power supply module includes at least a voltage regulator for regulating a supply voltage from the power supply source. The power supply module further includes at least a converter for converting an AC supply voltage to a DC supply voltage or a DC supply voltage to the AC supply voltage.

The computing server further comprises a first processing module and a second processing module connected to the power supply for receiving electrical power. The first and second processing modules are held in their respective positions by means of a plurality of slots of a slot arrangement of the cabinet assembly. The computing server further comprises a motherboard module connected to the power supply module for receiving electrical power and connected to at least one of the first and second processing modules. The motherboard module is mounted on a chassis arrangement having a plurality of legs that are attached to a bottom portion of the cabinet assembly. The computing server further comprises a fan module including a plurality of fans connected to the power supply module for receiving electrical power that turns ON the plurality of fans for dissipating heat generated by the computing server. The pluralities of fans are held in their position by at least the slot arrangement of the cabinet assembly.

In an embodiment, the cabinet assembly enclosing the computing server (i.e., the ServerCube device) is intended for distribution to residencies, small offices, libraries, churches, and schools. The goal is to create a global high-density swarm computing network without owning or building datacenters. Swarm intelligence utilizes mobile software agents for network management. These agents are autonomous entities, both proactive and reactive, and have the capability to adapt, cooperate and move intelligently from one location to the other in the communication network.

The complete ServerCube ecosystem consists of a ServerCube Device (i.e., the computing server) plus a ServerCube Network and a ServerCube Connect (middleware fabric). The implementation of the present invention harnesses the high-performance computing muscle of SC Devices collectively to distribute vast computational resources to the peer-to-peer (P2P) network. The built-in redundancy of all networked SC Devices creates highly efficient and effective security and stability.

These and other features and advantages of the invention will become apparent from the detailed description below, in light of the accompanying drawings.

BRIEF DESCRIPTION OF THE ACCOMPANYING DRAWINGS

The novel features which are believed to be characteristic of the present disclosure, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only and are not intended as a definition of the limits of the invention. Embodiments of this disclosure will now be described by way of example in association with the accompanying drawings in which:

Figure 1:
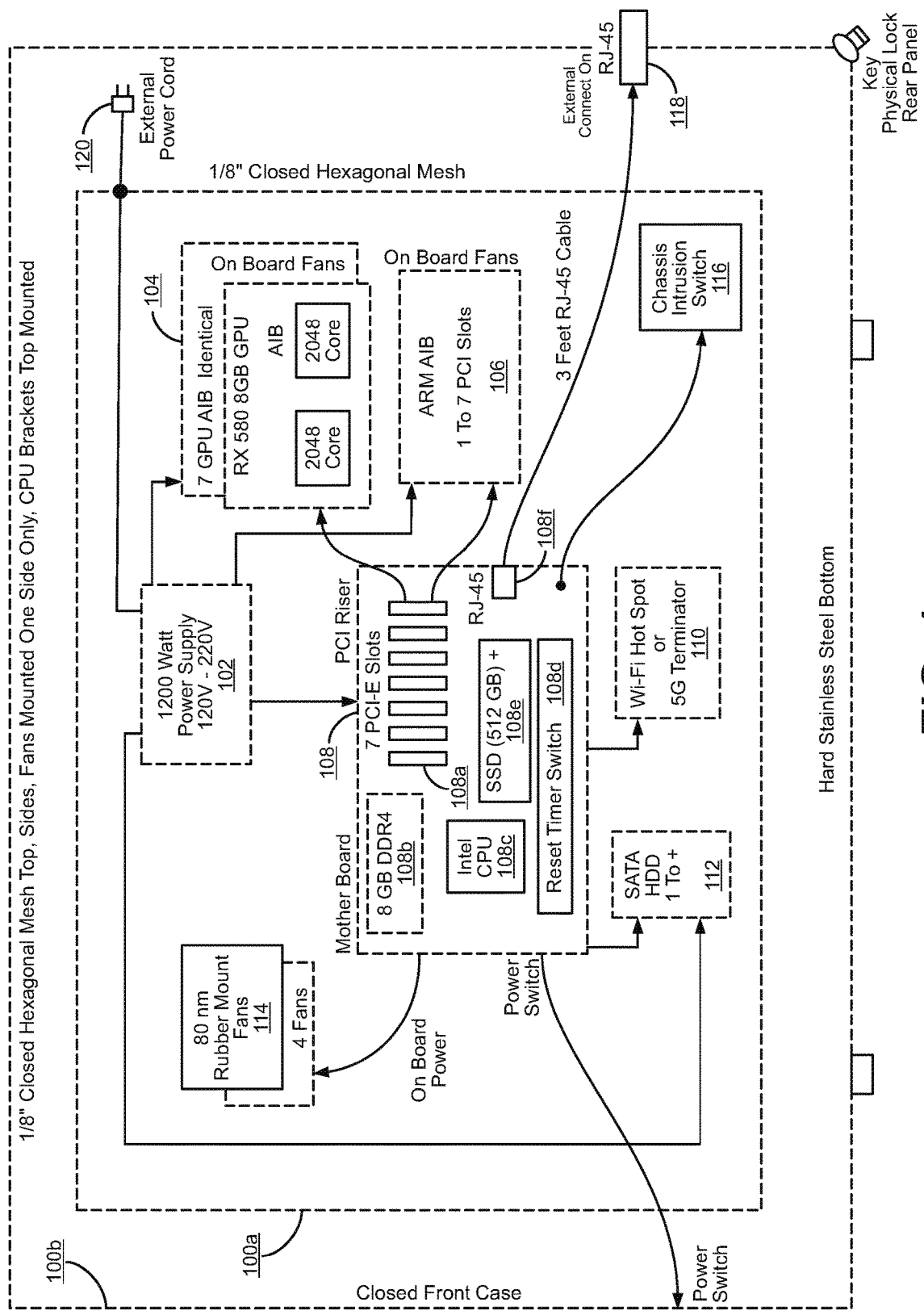
FIG. 1 is a block diagram that shows various components of a computing server housed inside a cabinet assembly, in accordance with an embodiment of the present invention.

Further areas of applicability of the present invention will become apparent from the detailed description provided hereinafter. It should be understood that the detailed description of exemplary embodiments is intended for illustration purposes only and is, therefore, not intended to necessarily limit the scope of the invention.

DETAILED DESCRIPTION

As used in the specification and claims, the singular forms "a", "an" and "the" may also include plural references. For example, the term "an article" may include a plurality of articles. Those with ordinary skill in the art will appreciate that the elements in the Figures are illustrated for simplicity and clarity and are not necessarily drawn to scale. For example, the dimensions of some of the elements in the Figures may be exaggerated, relative to other elements, in order to improve the understanding of the present invention. There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of mechanical components, which constitutes a cabinet assembly for a server. Accordingly, the components have been represented, showing only specific details that are pertinent for an understanding of the present invention so as not to obscure the disclosure with details that will be readily apparent to those with ordinary skill in the art having the benefit of the description herein. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

References to "one embodiment", "an embodiment", "another embodiment", "yet another embodiment", "one example", "an example", "another example", "yet another example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

The words "comprising," "having," "containing," and "including," and other forms thereof, are intended to be equivalent in meaning and be open ended in that an item or items following any one of these words is not meant to be an exhaustive listing of such item or items or meant to be limited to only the listed item or items.

Techniques consistent with the present invention provide, among other features, the cabinet assemble for the server. Unless stated otherwise, terms such as "first" and "second" are used to arbitrarily distinguish between the elements such terms describe. Thus, these terms are not necessarily intended to indicate temporal or other prioritization of such elements. While various exemplary embodiments of the disclosed system and method will be described below it should be understood that they have been presented for purposes of example only, not limitations. It is not exhaustive and does not limit the invention to the precise form disclosed. Modifications and variations are possible in light of the above teachings or may be acquired from practicing of the invention, without departing from the breadth or scope.

The cabinet assembly for the server will now be described with reference to the accompanying drawings which should be regarded as merely illustrative without restricting the scope and ambit of the disclosure.

FIG. 1 is a block diagram that shows various components of a computing server 100a housed inside a cabinet assembly 100b, in accordance with an embodiment of the present invention. The computing server 100a is a computing device, a software framework, or a combination thereof, that may provide a generalized approach to create the server implementation. In an embodiment, the various operations of the computing server 100a may be dedicated to execution of procedures, such as, but not limited to, programs, routines, or scripts stored in a memory for supporting its applied applications. The computing server 100a may be realized through various web-based technologies, such as, but not limited to, a Java web-framework, a .NET framework, a PHP framework, or any other web-application framework. The computing server 100a includes various components such as, but is not limited to, a power supply module 102, a first processing module 104, a second processing module 106, a motherboard module 108, a communication module 110, a memory module 112, a fan module 114, a switching module 116, and a connector module 118. The cabinet assembly 100b is a cabinet enclosure having six sides that houses the computing server 100a and has a width of 14 inches, a height of 12 inches, and a length of 16.75 inches.

The power supply module 102 is an electrical device that supplies electric power to an electrical load. The primary function of power supply module 102 is to convert electric current from a source to the correct voltage, current, and frequency to power the load. As a result, power supplies are sometimes referred to as electric power converters. The power supplies are controlled to maintain a required power output level and operate the power supplies at a preferred efficiency. The power supply module 102 is externally connected to a power supply source by means of an external power chord 120, takes "wall power" and distributes this power to all internal components. In case of solar panel installation, the operation of the computing server 100a is supported by the solar panel installation and an inverter bank which is part of that installation.

Also, the power supply module 102 includes a voltage regulator and a converter. The voltage regulator automatically maintains a constant voltage level. The voltage regulator may use a simple feed-forward design or may include negative feedback. It may use an electromechanical mechanism, or electronic components. Depending on the design, the voltage regulator may be used to regulate one or more alternating current (AC) or direct current (DC) voltages. The converter is an electrical or electro-mechanical device that converts electric energy from one form to another form, for example, from AC to DC or DC to AC.

In an embodiment, the power supply module 102 may be placed on a bottom surface along a back section of the cabinet assembly 100b. The back section is an open gateway for externally connecting the power supply module 102. For example, the open gateway may be used for connecting power supply module 102 with the power supply source by means of the power supply chord 120.

In an exemplary embodiment of the present invention, the power supply module 102 includes an HXi Series™ HX1000i High-Performance ATX Power Supply. The HXi Series power supply units are designed for gaming rigs, overclocking systems, or any PC where rock-solid stability is essential. Corsair HXi Series PSUs have earned 80 PLUS Platinum certification to guarantee cool, quiet, and efficient operation. Fully modular cabling allows to use just the cables needed, for better looking system builds with improved airflow and less cable clutter. The HXi Series is certified 80 PLUS® Platinum, which results in lower heat generation and a quieter fan profile. The HXi Series is so efficient that the 140 mm fan doesn't even spin at low loads for completely noiseless power delivery. The HXi Series monitors power supply performance, toggles single rail or multi rail mode, and controls fan speed directly by connecting the included cable to a motherboard USB header and downloading the free Corsair Link Dashboard application. The HX1000i power supplies facilitate over-voltage protection, over-current protection, over-temperature protection, and short-circuit protection. In an embodiment, the power supply module 102 is connected to the first processing module 104 and supplies electrical power to each Graphics Processing Unit (GPU) of the first processing module 104. In an embodiment, the power supply module 102 is further connected to the second processing module 106 and supplies electrical power to each Advanced Reduced Instruction Set Computer Machine (ARM) of the second processing module 106. In an embodiment, the power supply module 102 is further connected to the motherboard module 108 and supplies electrical power to one or more components of the motherboard module 108. In an embodiment, the power supply module 102 is further connected to the memory module 112 and supplies electrical power to the memory module 112. Further, in an embodiment, the power supply module 102 self regulates power to various components as they draw or demand power. The maximum power for each component has been calculated with 10% overage available for the maximum power supply wattage output.

The first processing module 104 is a module that includes a series of GPUs that are connected to the power supply module 102 for receiving the required power supply for its operation. A GPU is a specialized electronic circuit designed to rapidly manipulate and alter memory to accelerate the creation of images in a frame buffer intended for output to a display device. The GPUs are used in embedded systems, mobile phones, personal computers, workstations, and game consoles. The GPU may include a graphics memory controller, a compression unit, a graphics and compute array, a bus interface, a power management unit, a video processing unit, an onboard fan, and a display interface.

In an exemplary embodiment of the present invention, the first processing module 104 includes a set of Add-in Board for Graphical Processing Units (GPU AIB). The GPU AIBs are processors which can run AI, VR Modeling/Gaming, and BaaS programs with higher speed than CPU based technology. These boards come with their own memory chips. Each GPU is an RX 580 8 GB GPU.

The second processing module 106 is a module that includes a set of ARMs that are connected to the power supply module 102 for receiving the required power supply for its operation. An Arm is an Advanced RISC Machine. A RISC has a fixed 32-bit instruction size and large register bank of GPR 32-bit registers, and is easier to prototype and put together. In simply ways, The ARM is a processor architecture based on a 32-bit reduced instruction set (RISC) computer. The ARM supports high code density, low power consumption, and smaller size. An ARM processor has a large uniform register file. It is basically a LOAD-STORE architecture where data processing operations are only between registers and does not involve any memory operations. The ARM processor is a 32 bit processor but also includes variants of 16 bits and 8 bits architectures. The ARM processor has very good speed Vs power consumption ratio and high code density as required by the embedded applications. The ARM processor also includes a barrel shifter in the data path that can maximize the hardware usage available on the chip. The ARM processor also has auto increment and decrement addressing modes to optimize program loops. Also, the ARM processor supports LOAD and STORE of multiple data elements through a single instruction. The ARM processor has also got a feature named "conditional execution", where an instruction gets executed only when a condition is being met, which maximizes the execution throughput.

In an exemplary embodiment of the present invention, the second processing module 106 includes one or more Add-in Boards for ARM. These are the processors which can run AI, VR Modeling/Gaming, and BaaS programs with higher speed than CPU based technology. These boards come with their own memory chips. Each ARM AIB includes one to seven peripheral component interconnect (PCI) slots. A PCI slot is a connecting apparatus for a 32-bit computer bus. These tools are built in order to allow for the addition of PCI devices like modems, network hardware, or sound and video cards.

In an embodiment, each GPU and/or ARM may be held in position by means of a plurality of slots in a slot arrangement of the cabinet assembly 100b. The slot arrangement having the plurality of slots may be attached to the top portion of the cabinet assembly 100b. The plurality of slots are used for holding at least a plurality of processing components (such as the GPUs and/or ARMs) of the computing server 100a inside the cubical compartment. Each processing component is held to a respective slot of the slot arrangement by means of a plurality of metallic clamps while they are attached to their respective slots. Further, at least one slot of the plurality of slots is used for holding a cooling pad including at least a plurality of fans.

The motherboard module 108 is a sheet of plastic that holds all the circuitry to connect the various components of the computing server 100a. For example, the motherboard module 108 holds together one or more CPUs, GPUs, ARMs, memory, and connectors for input and output devices. The base of the motherboard module 108 consists of a very firm sheet of non-conductive material, typically some sort of rigid plastic. Thin layers of copper or aluminum foil, referred to as traces, are printed onto this sheet. These traces are very narrow and form the circuits between the various components. In addition to circuits, the motherboard module 108 contains a number of sockets and slots to connect the other components. For example, the motherboard module 108 includes a CPU socket onto which an actual CPU (such as the CPU 108c) is directly soldered. Since high speed CPUs generate a lot of heat, there are heat sinks and mounting points for fans right next to the CPU socket. The motherboard module 108 further includes a power connector to distribute power to the CPU 108c and other components, slots for the server's main memory (such as the memory 108b), typically in the form of DRAM chips, such as DDR4 SDRAM (double data rate fourth-generation synchronous dynamic random-access memory). A chip forms an interface between the CPU, the main memory, and other components. This chip also contains a large heat sink. A second chip controls the input and output (I/O) functions. The motherboard module 108 further includes several connectors (such as an RJ-45 connector 108f), which provide the physical interface between input and output devices and the motherboard module 108 or between the GPUs or ARMs and the motherboard module 108. The motherboard module 108 further includes slots for one or more hard drives (such as the memory 108e) to store files. The memory 108e (such as Solid State Disks (SSDs) 108e) is permanent storage device without moving parts which are faster than Hard Disk Drives (HDDs). These contain encrypted data areas with unique certificate keys. The most common types of connections are Integrated Drive Electronics (IDE) and Serial Advanced Technology Attachment (SATA). A read-only memory (ROM) chip, which contains the firmware, or startup instructions for the computing server 100a. The motherboard module 108 further includes a plurality of slots (such as a 7 PCI-E slots 108a) for video or graphics cards such as the GPUs and/or ARMs. There are a number of different types of slots, including the Accelerated Graphics Port (AGP) and Peripheral Component Interconnect Express (PCI-E). Additional slots to connect hardware in the form of Peripheral Component Interconnect (PCI) slots. The motherboard module 108 further includes a slot for including a reset time switch 108d. The motherboard module 108 further includes other additional connectors for connecting other components.

In an embodiment, the motherboard module 108 is mounted on a chassis arrangement of the cabinet assembly 100b. The chassis arrangement is included inside the cabinet assembly 100b for mounting at least one motherboard (such as the motherboard module 108) of the computing server 100a. The motherboard module 108 may be mounted on top of the chassis arrangement. The motherboard module 108 is connected to the power supply module 102 for receiving the power supply for various components for performing their operations.

The communication module 110 includes suitable logic, circuitry, and/or interfaces that are operable to execute one or more stored instructions stored to perform one or more operations. For example, the communication module 110 facilitates one or more communication channels, such as a data channel, for communicating with other remote servers such as the computing server 100a by way of a communication network. The communication network is a medium through which content and messages are transmitted between various entities. Examples of the communication network include, but are not limited to, a wireless fidelity (Wi-Fi) network, a light fidelity (Li-Fi) network, a local area network (LAN), a wide area network (WAN), a metropolitan area network (MAN), a satellite network, the Internet, a fiber optic network, a coaxial cable network, an infrared (IR) network, a radio frequency (RF) network, or any combinations thereof. Various entities may connect to the communication network in accordance with various wired and wireless communication protocols, such as Transmission Control Protocol and Internet Protocol (TCP/IP), User Datagram Protocol (UDP), $2^{nd}$ Generation (2G), $3^{rd}$ Generation (3G), $4^{th}$ Generation (4G), $5^{th}$ Generation (5G) communication protocols, Long Term Evolution (LTE) communication protocols, or any combination thereof.

The memory module 112 includes suitable logic, circuitry, and/or interfaces to store the one or more instructions that are executed by various components of the computing server 100a to perform their operations. Examples of the memory module 112 include, but are not limited to, a random-access memory (RAM), a read-only memory (ROM), a programmable ROM (PROM), and an erasable PROM (EPROM). In an exemplary embodiment of the present invention, the memory module 112 may correspond to a SATA Storage (a type of rewritable mass storage device characterized by respectable transmission speeds, excellent storage capacities, and flawless support by virtually all operating systems and computer motherboards). The SATA is a Hard Disk Drive with moving parts, which can store much larger amounts of data at a lower cost. These are using for sharding data sets for Deep Learning AI processing. The SATA HDD may be connected to the power supply module 102 for receiving power supply. The SATA HDD may further be connected to the motherboard module for receiving or transmitting data to and from the motherboard module 108.

The fan module 114 includes a plurality of fans that are mounted on a cooling pad that may be held in position by the slot arrangement of the cabinet assembly 100b. In another embodiment, the plurality of fans may be attached to a fan mounting bracket of the cabinet assembly 100b. The fan mounting bracket is attached to an outer surface of side portion of the cabinet assembly 100b. The fan mounting bracket is further attached with the plurality of fans in their respective slots for dissipating heat generated by the computing server 100a. Each of the plurality of fans has a power supply chord that is connected to the power supply module 102 for receiving power supply, and hence gets turned ON. The plurality of fans are provided with rubber molding and rubber retainers to reduce noise and provide unidirectional cooling. Furthermore, the computing server 100a enclosed inside the cabinet assembly 100b has a higher percentage of open air flow (around 81% in current Generation 2 prototype but will be about 72% in final production version). Also, using the plurality of fans with rubber mounts and rubber molding reduce vibration and noise. Also, the plurality of fans are brushless. Also, the orientation of the plurality of fans provides maximum airflow across the AIBs which is where the majority of heat is generated. Also, the AIBs have their own on-board fans.

The switching module 116 is a switch arrangement that turns off a unit (such as the motherboard module 108) or sends an alert each time the attached case panel of the cabinet assembly 100b is opened. In an exemplary embodiment, the switching module 116 includes a chassis intrusion switch. The chassis intrusion switch detects any intrusion into the interior of the cabinet assembly 100b and provides an indication of the same. This switch is activated as soon as the cover of the cabinet assembly 100b is removed and any access is made to the interior of the cabinet assembly 100b.

The connector module 118 is a connector assembly used for Ethernet networking. For example, the connector module 118 may include an RJ-45 connector. The "RJ" in RJ-45 stands for "registered jack" since it is a standardized networking interface. The "45" simply refers to the number of the interface standard. Each RJ-45 connector has eight pins, which means an RJ-45 cable contains eight separate wires. Four of them are solid colors, while the other four are striped. The RJ-45 cables can be wired in two different ways. One version is called T-568A and the other is T-568B. In an embodiment, the RJ-45 118 is connected to the RJ-45 108f by means of an RJ-45 cable (e.g., 3 feet RJ-45 cable).

Figure 2:
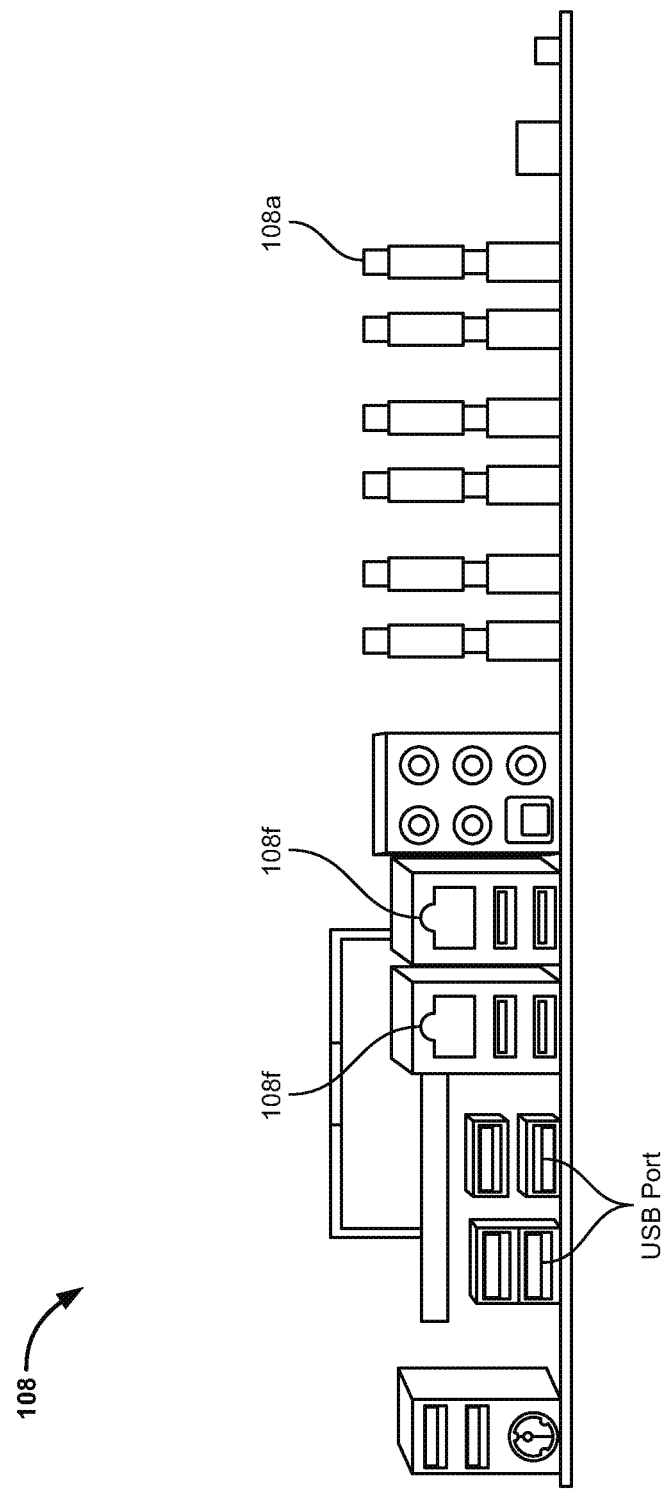
FIG. 2 is a block diagram that illustrates a front view of a motherboard module of the computing server of FIG. 1, in accordance with an embodiment of the present invention.

FIG. 2 is a block diagram that illustrates a front view of the motherboard module 108 of the computing server 100a, in accordance with an embodiment of the present invention. The motherboard module 108 contains a number of sockets and slots to connect the other components. For example, the motherboard module 108 includes a CPU socket onto which an actual CPU (such as the CPU 108c) is directly soldered. Since high speed CPUs generate a lot of heat, there are heat sinks and mounting points for fans right next to the CPU socket. The motherboard module 108 further includes a power connector to distribute power to the CPU 108c and other components, slots for the server's main memory (such as the memory 108b), typically in the form of DRAM chips. A chip forms an interface between the CPU, the main memory, and other components. This chip also contains a large heat sink. A second chip controls the input and output (I/O) functions. The motherboard module 108 further includes several connectors (such as an RJ-45 connector 108f), which provide the physical interface between input and output devices and the motherboard module 108 or between the GPUs or ARMs and the motherboard module 108. The motherboard module 108 further includes slots for one or more hard drives (such as the memory 108e) to store files. The memory 108e (such as Solid State Disks (SSDs) 108e) are permanent storage devices without moving parts which are faster than Hard Disk Drives (HDDs). These contain encrypted data areas with unique certificate keys. The most common types of connections are Integrated Drive Electronics (IDE) and Serial Advanced Technology Attachment (SATA). A read-only memory (ROM) chip, which contains the firmware, or startup instructions for the computing server 100a. The motherboard module 108 further includes a plurality of slots (such as a 7 PCI-E slots 108a) for video or graphics cards such as the GPUs and/or ARMs. There are a number of different types of slots, including the Accelerated Graphics Port (AGP) and Peripheral Component Interconnect Express (PCIe). Additional slots to connect hardware in the form of Peripheral Component Interconnect (PCI) slots. The motherboard module 108 further includes a slot for including a reset time switch 108d. The motherboard module 108 further includes connector.

Figure 3:
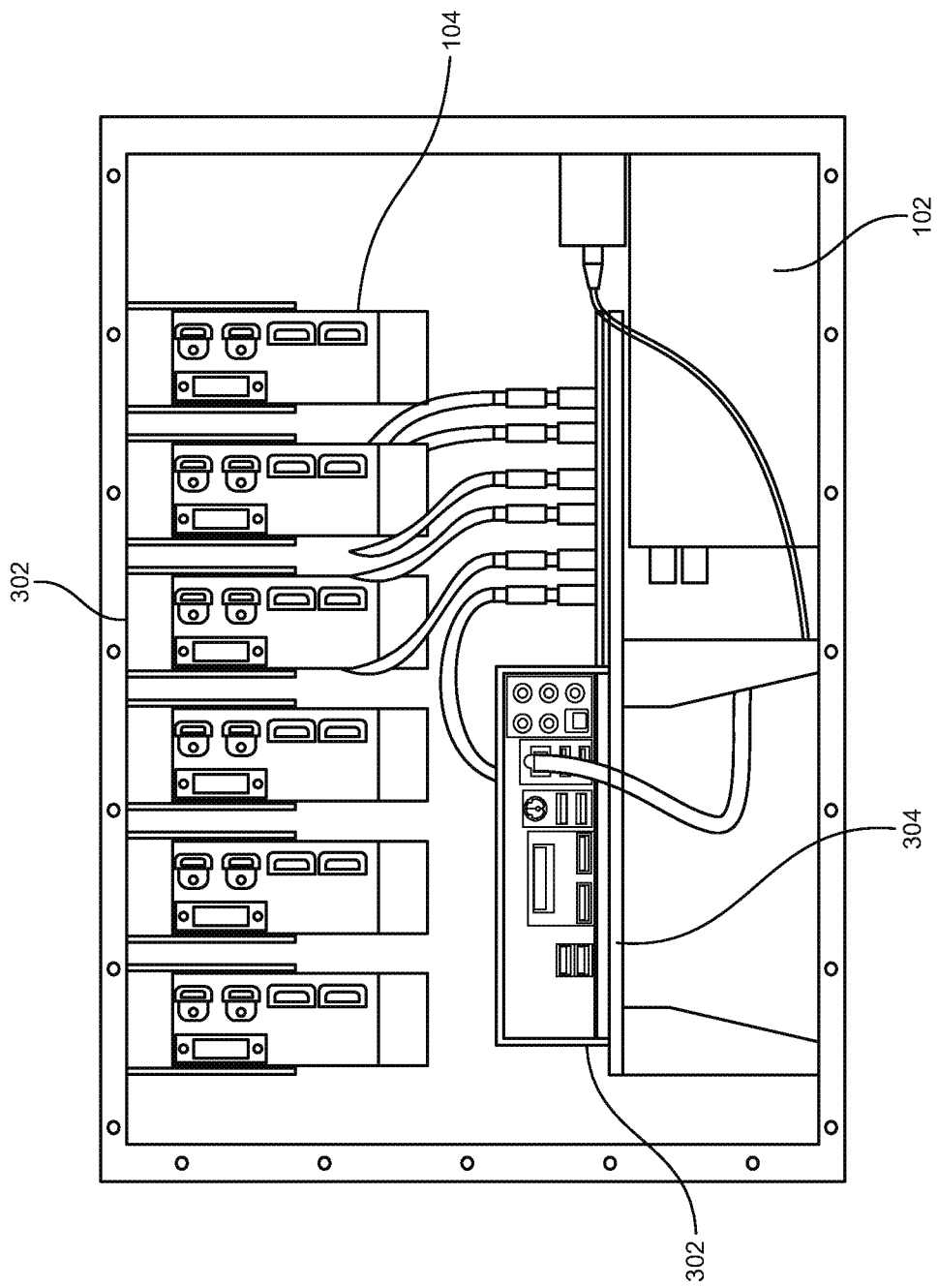
FIG. 3 is a block diagram that illustrates a backside view of the computing server of FIG. 1, in accordance with an embodiment of the present invention.

FIG. 3 is a block diagram that illustrates a backside view of the computing server 100a, in accordance with an embodiment of the present invention. The computing server 100a as illustrated includes at least one of the first and second processing modules 104 and 106 (such as the one or more GPUs and/or ARMs) that are held in position by means of the plurality of slots in the slot arrangement 302 of the cabinet assembly 100b. The at least one of the first and second processing modules 104 and 106 are connected to the motherboard module 108 by means of appropriate cables. The slot arrangement having the plurality of slots is attached to the top portion of the cabinet assembly 100b as shown.

Further, one of the plurality of slots may be used for holding a cooling pad including at least a plurality of fans. The computing server 100a further illustrates the power supply module 102 that supplies electrical power to different components of the computing server 100a.

The computing server 100a further illustrates the motherboard module 108 that is mounted on the chassis arrangement 304 of the cabinet assembly 100b. The chassis arrangement 304 has been included inside the cabinet assembly 100b for mounting at least one motherboard (such as the motherboard module 108) of the computing server 100a. The motherboard module 108 has been mounted on top of the chassis arrangement 304. The chassis arrangement 304 has a plurality of legs that are attached to the base of the cabinet assembly 100b.

Figure 4:
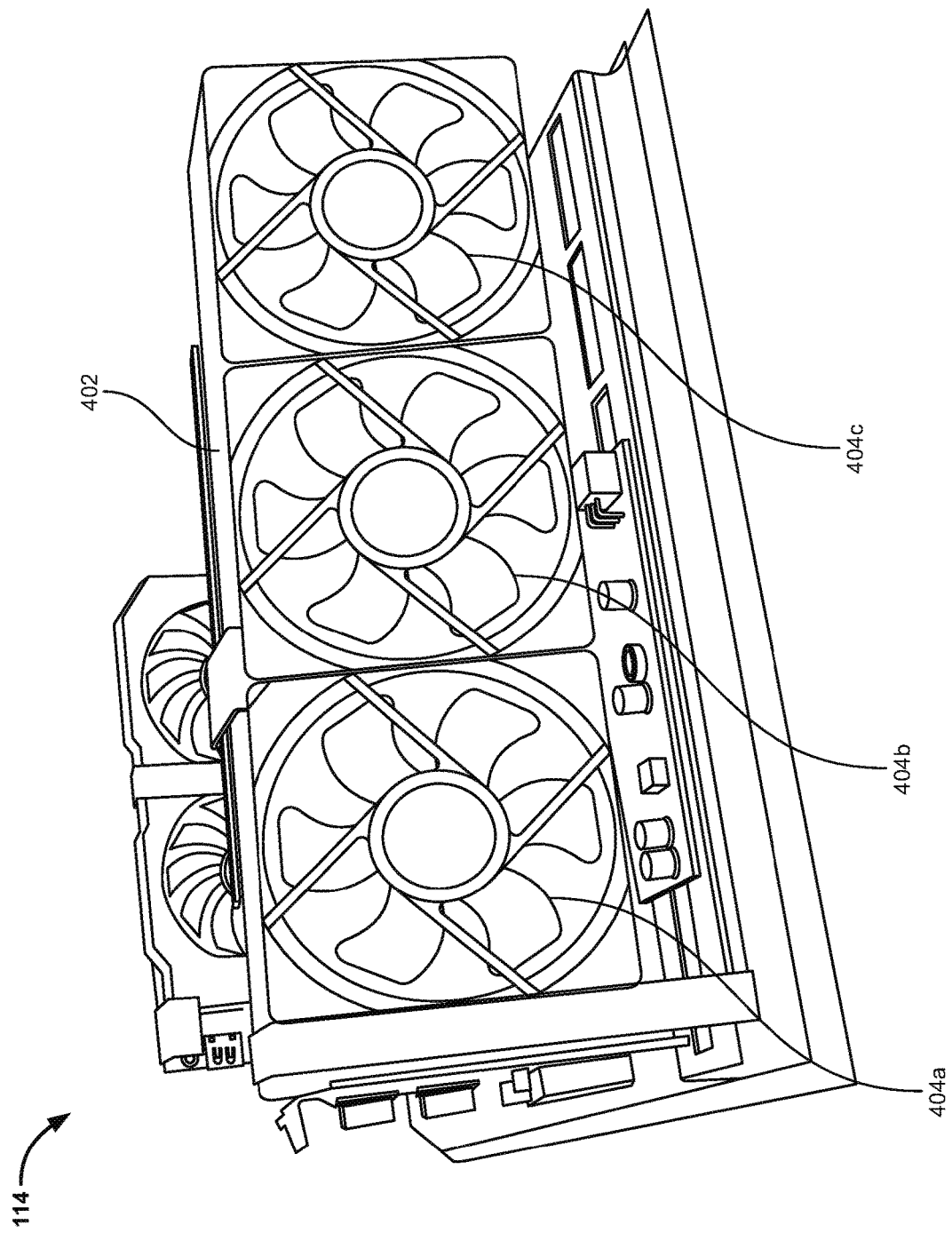
FIG. 4 shows a fan module of the computing server of FIG. 1, in accordance with an embodiment of the present invention.

FIG. 4 shows the fan module 114 of the computing server 100a, in accordance with an embodiment of the present invention. The fan module 114 includes a fan mounting bracket 402. The dimension of the fan mounting bracket 402 is 14.25 inches by 4.25 inches. The fan mounting bracket 402 includes the plurality of fan slots, such as first, second, and third fan slots. The width of each fan slot is 2.82 inches. Each fan slot of the fan mounting bracket 402 includes at least two arcs of the same radius and the two arcs are arranged opposite to each other. Further, the radius of each arc is 1.593 inches. The plurality of fan slots are formed such that there is a gap between two adjacent fans when mounted therein. For example, the gap is 0.433 inch between two adjacent mounting spaces associated with their respective fan slots. The plurality of fans (such as the fans 402a, 402b, and 402c) are mounted in their respective fan slots by means of screws. The mounting of each fan requires at least four screws. Each of the plurality of fans has a power supply chord that can be connected to the power supply module 102 for turning ON the respective fan. The plurality of fans are provided with rubber molding and rubber retainers to reduce noise and to provide unidirectional cooling.

Figure 5:
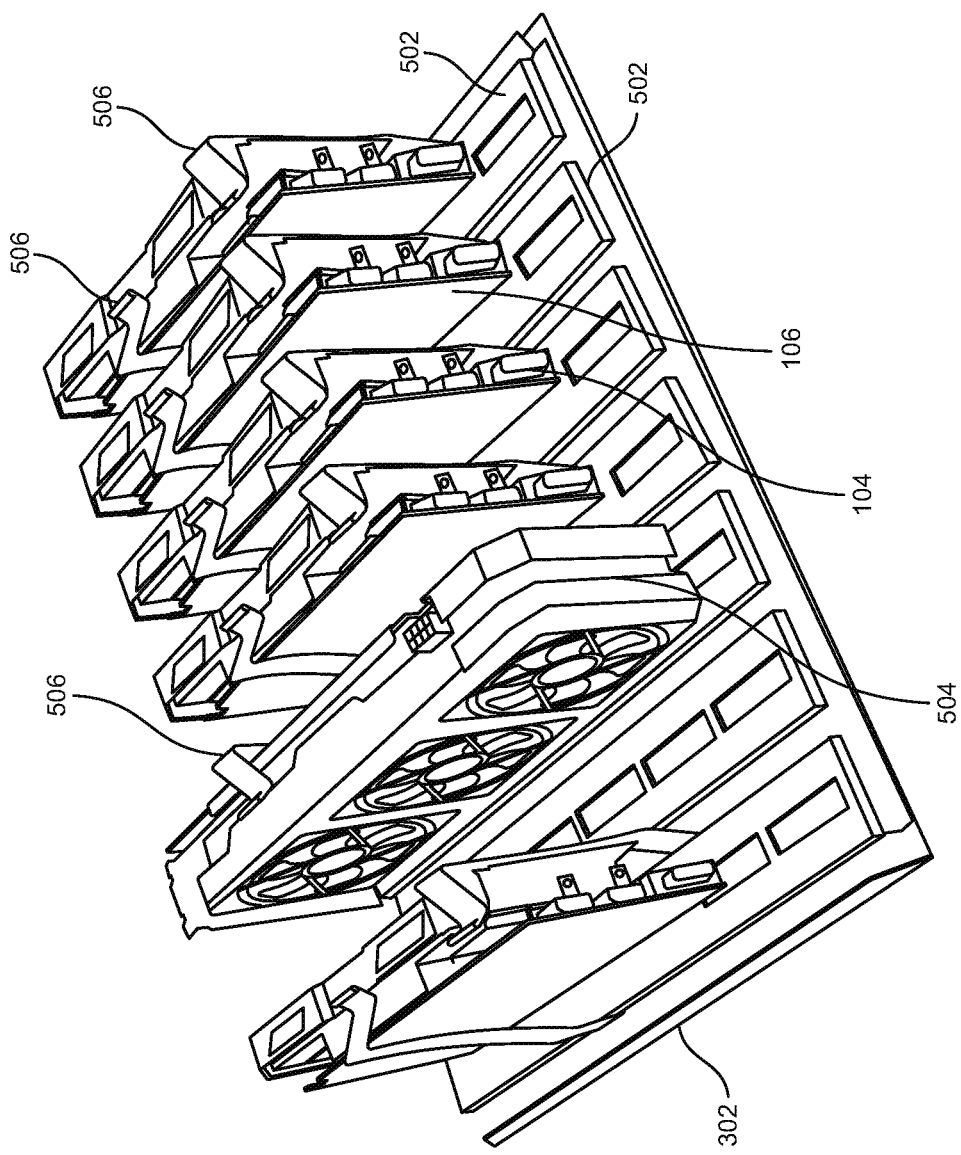
FIG. 5 shows a slot arrangement of a cabinet assembly that houses the computing server of FIG. 1, in accordance with an embodiment of the present invention.

FIG. 5 shows the slot arrangement 302 of the cabinet assembly 100b that houses the computing server 100a, in accordance with an embodiment of the present invention. The computing server 100a illustrates at least one of the first and second processing modules 104 and 106 (such as the one or more GPUs and/or ARMs) that are held in position by means of the plurality of slots 502 in the slot arrangement 302 of the cabinet assembly 100b. Further, one of the plurality of slots 502 may be used for holding the cooling pad 504 including at least the plurality of fans. The plurality of slots 502 are used for holding at least the plurality of processing components (such as the one or more GPUs and/or ARMs) of the computing server 100a inside the cubical compartment. Each processing component is held to its respective slot of the slot arrangement 302 by means of a plurality of metallic clamps 506. Further, at least one slot of the plurality of slots 502 is used for holding the cooling pad 504 including at least the plurality of fans.

Figure 6:
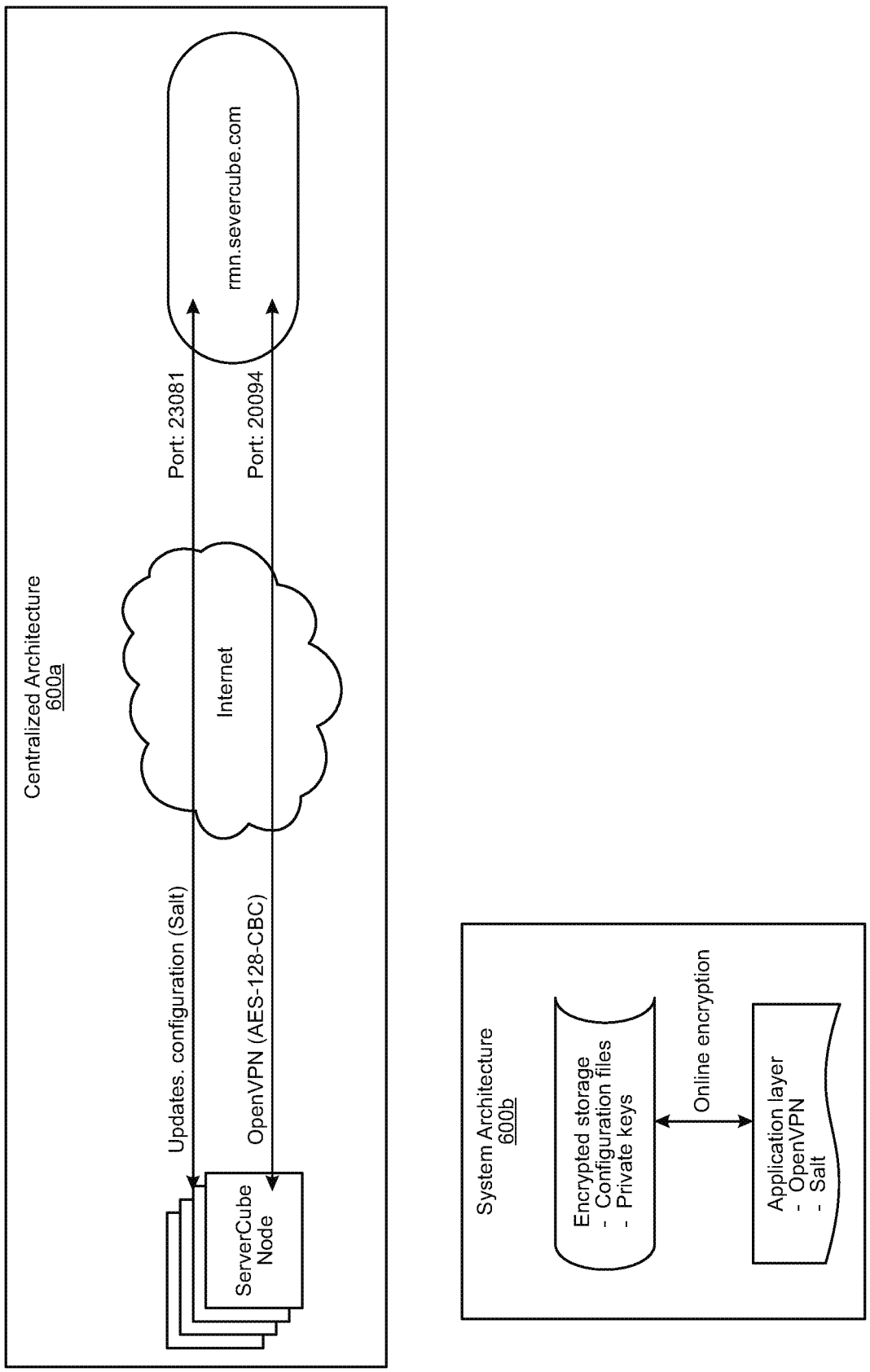
FIG. 6 shows a centralized architecture and a system architecture depicting an exemplary implementation of the computing server of FIG. 1, in accordance with an embodiment of the present invention.
Figure 7:
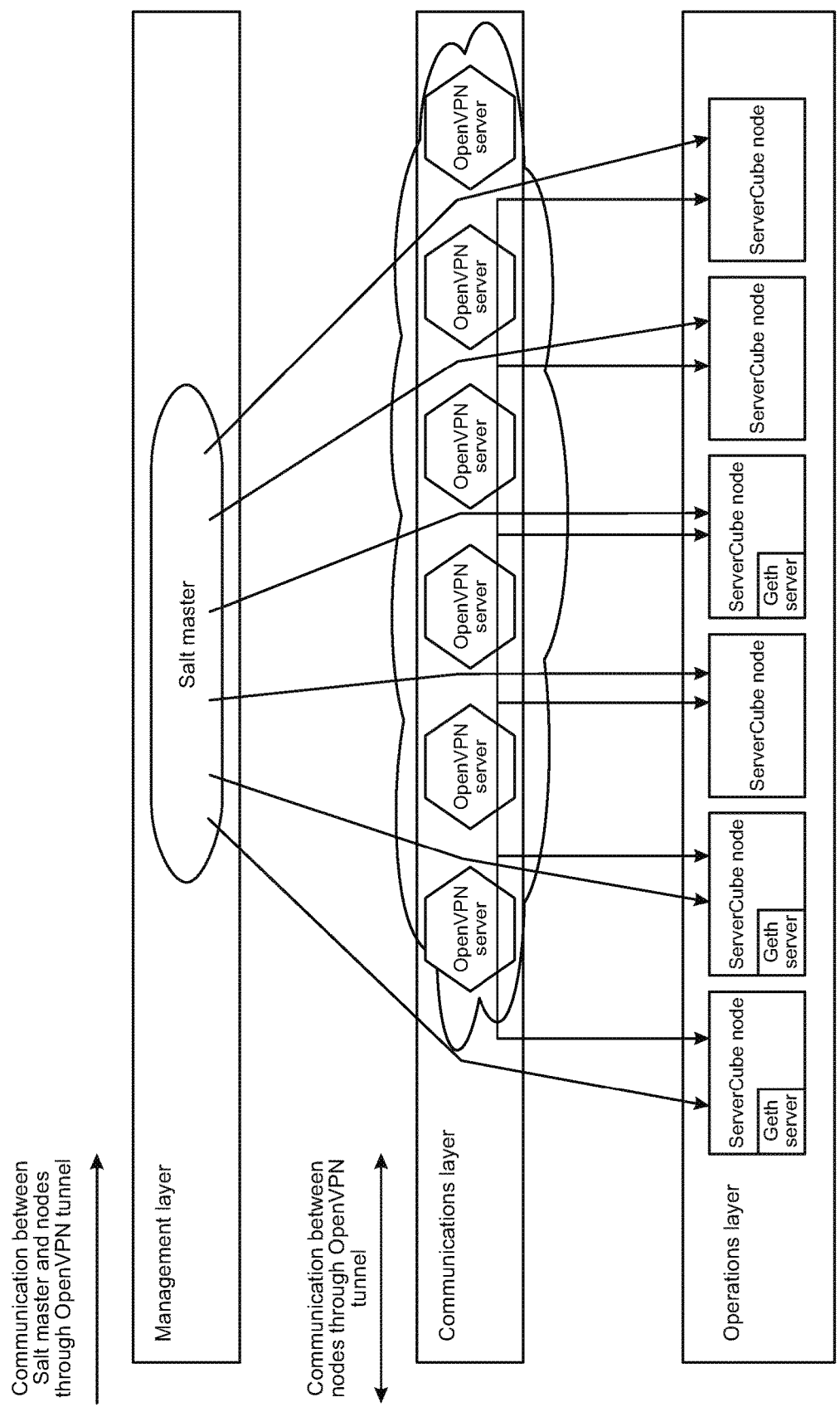
FIG. 7 shows various layers of communication between various ServerCube (SC) nodes, in accordance with an embodiment of the present invention.

FIG. 6 shows a centralized architecture 600a and a system architecture 600b depicting an exemplary implementation of the computing server 100a, in accordance with an embodiment of the present invention. FIG. 7 shows various layers of communication between various ServerCube (SC) nodes, in accordance with an embodiment of the present invention. The centralized architecture 600a shows a set of ServerCube nodes (such as SC nodes) that are communicating over the communication network, such as the Internet 602, with a remote web server (such as rmn.servercube.com). Each node corresponds to a unique computing server such as the computing server 100a. Each ServerCube node has a list of other nodes information table, for example, as shown below:

| Node name | Node IP | Node MAC-address | Node open key |
| --- | --- | --- | --- |

The node info is uploaded to the nodes when they are preparing on the factory. The node info updates from the remote web server if it is available. The node pings the nodes from the list periodically (for example per hour) and check if they are alive and measures ping time. The node with lowest ping time will be used as a primary contact. If node changes some information (IP, name etc.), it sends the updated information to all the nodes in list. The verification factors are: MAC-address and Open key. If the node must change the keys, it should be done with the server connection (server should verify the node identity with some other mechanism, for example—it checks the Salt connection. Open key in the table is for OpenVPN connection, the configuration change should be done only from server). Software updates can be performed from other nodes. All communications are going through the communications layer that is built from distributed OpenVPN server cloud. Salt master connects to the tunnel only on demand. The most time it is disconnected due to security reasons.

The cabinet assembly 100b enclosing the computing server 100a (i.e., the ServerCube device) is intended for distribution to residencies, small offices, libraries, churches, and schools. The goal is to create a global high-density swarm computing network without owning or building datacenters. Swarm intelligence utilizes mobile software agents for network management. These agents are autonomous entities, both proactive and reactive, and have the capability to adapt, cooperate and move intelligently from one location to the other in the communication network. Swarm intelligence, in particular, uses stigmergy (i.e. communication through the environment) for agent interaction. Swarm intelligence exhibits emergent behavior where in simple interactions of autonomous agents, with simple primitives, give rise to a complex behavior that has not been specified explicitly. Swarm intelligence is the self-organization of systems for collective decentralized behavior. Swarm intelligence enables groups to converge and create an independent organism that can do things that individuals can't do on their own. Swarm intelligence creates a virtual platform to enable distributed engagement from system users. Through this engagement, feedback can be provided in a closed-loop, swarming process. Swarm intelligence can be applied to immune systems, computer vision, navigation, mapping, image processing, artificial neural networks and robotic motion planning.

The complete ServerCube ecosystem consists of a ServerCube Device (i.e., the computing server 100a) plus a ServerCube Network and a ServerCube Connect (middleware fabric). The implementation of the present invention harnesses the high-performance computing muscle of SC Devices collectively to distribute vast computational resources to the peer-to-peer (P2P) network. The built-in redundancy of all networked SC Devices creates highly efficient and effective security and stability. As an internet connected device, the SC Device functions, including uptime and swarm extensions can be monitored. This kind of distributed computing network already lends itself to parallelization in the fields of climate modeling and deep learning AI. The immense capacity of the SC decentralized model has been for Blockchain development, and any application which requires distributed high-performance computing power, such as VR modeling, deep learning AI, and applications currently running on supercomputers such as climate modeling.

SC Connect is a dynamic middleware layer that shares encrypted data with counterparties outside of the SC network. It connects the outside world, enabling transactions across public Blockchains such as Ethereum, Bitcoin, or Dash and private Blockchains such as Corda, Hyperledger, etc. In addition, fiat currency transfers are supported on the network. The Connect layer offers several powerful features that enable build-out of applications and transactions. For example, the connect layer enables smart contracts to run independent from any Distributed Ledger Technology ("DLT"), allowing for seamless transactions within existing protocols. The framework is interoperable with public and private Blockchains; including institutional legacy systems in financial services. The SC connect offers a message-based API for sending and receiving messages to the SC platform. Furthermore, the SC connect confidentially execute transactions, encrypt and then write the results to the Blockchain. The logic also limits the decryption of the results to only those parties involved in the contract. This privacy model is agnostic to underlying Blockchains and allows for cipher diversity. It further supports the ability to both write the results of a single transaction to a private Blockchain and record a public record on a public network. With a single in-bound transaction request, the SC can perform single or multi-chain operations within the same transaction and return a single result. A full transaction context group contains each transaction's proof and receipt to provide a composite receipt and proof audit report. It performs integration across Blockchain types using smart contracts as a router and gateway across a mixture of networks. Thus, the SC Connect framework allows for extensive integration logic between networks.

The SC Device is the next-generation residential mini-supercomputers connected to other SC Devices around the world forming the SC P2P swarm network. Set-up is simple, for example, plug and-play into any standard (1200-Watt) household outlet, requiring only a basic consumer broadband connection to connect to the internet. Unlike "professional" mining rigs, it runs relatively quiet and cool and is encased for household safety. Currently, the SC Device offers commercial strength hash rate processing power (162 MH/s for ETH up to a maximum 225 MH/s), running over a basic 3 (three) Mbps connection. The SC device is also designed to be more energy efficient and uses 95% (ninety five percent) of its cubic space. With high performance computing SC devices, mining and other computing operations become highly efficient. The SC device efficiently houses 6 (six) GPU boards with overclocking at using less than 166 (one hundred and sixty-six) Watts each. It generates less than 60° C. of heat on contact at full load, while operating at 162 MH/s or greater.

Although particular embodiments of the invention have been described in detail for purposes of illustration, various modifications and enhancements may be made without departing from the spirit and scope of the invention.

What is claimed is:

1. A computing server housed in a cabinet assembly, the computing server comprising:
   a power supply module placed on a bottom surface of a back section of the cabinet assembly;
   a first processing module and a second processing module connected to the power supply module for receiving electrical power, wherein the first and second processing modules are held in their respective positions by means of a plurality of slots of a slot arrangement of the cabinet assembly, wherein the slot arrangement having the plurality of slots is attached to a top portion of the cabinet assembly such that the first and second processing modules are hanging from the top portion inside the cabinet assembly, and where each of the first and second processing modules is held to its respective slot of the slot arrangement by means of a plurality of metallic clamps;
   a motherboard module connected to the power supply module for receiving electrical power and connected to at least one of the first and second processing modules, wherein the motherboard module includes a socket onto which a processor is directly soldered, wherein the motherboard module further includes an RJ-45 connector that provide a physical interface between input and output devices and the motherboard module, wherein the motherboard module is mounted on top of a chassis arrangement having a plurality of legs that are attached to a bottom portion of the cabinet assembly, and wherein a portion of the power supply module is located in a space below the chassis arrangement that is closer to at least one of the plurality of legs; and
   a fan module including a plurality of fans connected to the power supply module for receiving electrical power that turns ON the plurality of fans for dissipating heat generated by the computing server, wherein one or more fans of the plurality of fans are mounted on a cooling pad that is held in its position by at least the slot arrangement of the cabinet assembly such that the cooling pad is hanging from the top portion inside the cabinet assembly, and where the cooling pad is held to its slot of the slot arrangement by means of a plurality of metallic clamps, and wherein one or more fans of the plurality of fans are attached to a fan mounting bracket of the cabinet assembly, and wherein the fan mounting bracket is attached to an outer surface of a side portion of the cabinet assembly.

2. The computing server of claim 1, wherein the power supply module is externally connected to a power supply source by means of an external power chord, wherein the power supply module includes at least a voltage regulator for regulating a supply voltage from the power supply source, and wherein the power supply module includes at least a converter for converting an AC supply voltage to a DC supply voltage or a DC supply voltage to the AC supply voltage.

3. The computing server of claim 2, wherein the power supply module is an HXi Series HX1000i High-Performance ATX Power Supply for facilitating lower heat generation and a quieter fan profile, wherein the power supply module monitors power supply performance, toggles single rail or multi rail mode, and controls fan speed of the plurality of fans, and wherein the power supply module facilitates over-voltage protection, over-current protection, over-temperature protection, and short-circuit protection.

4. The computing server of claim 1, wherein the first processing module includes a set of Add-in Board for Graphical Processing Units (GPU AIB), wherein each GPU is an RX 580 8 GB GPU.

5. The computing server of claim 1, wherein the second processing module includes a set of Add-in Boards for Advanced RISC Machines (ARM AIB), wherein each ARM AIB includes one to seven peripheral component interconnect (PCI) slots, and wherein each PCI slot is a connecting apparatus for a 32-bit computer bus, and wherein each ARM AIB includes a barrel shifter in data path for maximizing hardware usage available on a chip, and wherein each ARM AIB includes auto increment and decrement addressing modes to optimize program loops.

6. The computing server of claim 1, wherein the motherboard module includes at least a first memory and a second memory, wherein the first memory is a double data rate synchronous dynamic random-access memory (DDR SDRAM) and the second memory is a solid-state storage device (SSD).

7. The computing server of claim 6, wherein the motherboard module further includes one or more slots for including a central processing unit (CPU), a reset timer switch, and a plurality of peripheral component interconnect express (PCI-E) slots.

8. The computing server of claim 1, further comprising a communication module connected to the motherboard module that facilitates one or more communication channels for communicating with other computing servers or a central web server.

9. The computing server of claim 1, further comprising a third memory connected to the power supply module for receiving electrical power and the motherboard module, wherein the third memory is a rewritable mass storage device.

10. The computing server of claim 1, wherein the plurality of fans are provided with rubber molding and rubber retainers to reduce noise and provide unidirectional cooling.

11. The computing server of claim 1, further comprising a switching module including at least a chassis intrusion switch that detects any intrusion into interior of the cabinet assembly and turns OFF the motherboard module or generates an alert based on the detected intrusion, wherein the chassis intrusion switch is activated a cover of the cabinet assembly is removed and any access is made to interior of the cabinet assembly.

12. The computing server of claim 1, wherein the cabinet assembly is a cabinet enclosure having six sides that houses the computing server and having a width of 14 inches, a height of 12 inches, and a length of 16.75 inches, and with such dimension, the cabinet assembly is a compact and sturdy structure for enclosing the computing server that can operate in private residences or in small clusters for performing blockchain-as-a-service (BaaS) applications.

13. The computing server of claim 1, wherein a global high-density swarm computing network is established using multiple computing servers without owning or building datacenters, wherein swarm intelligence utilizes mobile software agents for network management, where the agents are autonomous entities, both proactive and reactive, and have capability to adapt, cooperate and move intelligently from one location to other in a communication network.

14. The computing server of claim 10, wherein the plurality of fans are brushless, and wherein orientation of the plurality of fans provides maximum airflow across the first and second processing modules including AIBs which is where majority of heat is generated.

15. The computing server of claim 14, wherein dimension of the fan mounting bracket is 14.25 inches by 4.25 inches, wherein a width of each fan slot in the fan mounting bracket is 2.82 inches, wherein each fan slot of the fan mounting bracket includes at least two arcs of the same radius and the two arcs are arranged opposite to each other, and wherein a radius of each arc is 1.593 inches.

16. The computing server of claim 1, further comprising a connector module including an RJ-45 connector that is connected to the RJ-45 connector of the motherboard module by means of an RJ-45 cable.

* * * * *